United States Patent
Kamgaing et al.

(10) Patent No.: US 11,509,069 B2
(45) Date of Patent: *Nov. 22, 2022

(54) DISTRIBUTED ON-PACKAGE MILLIMETER-WAVE RADIO

(71) Applicant: Intel Corporation, Santa Clara, CA (US)

(72) Inventors: Telesphor Kamgaing, Chandler, AZ (US); Adel A. Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 32 days.

This patent is subject to a terminal disclaimer.

(21) Appl. No.: 16/901,243

(22) Filed: Jun. 15, 2020

(65) Prior Publication Data

US 2020/0313306 A1     Oct. 1, 2020

Related U.S. Application Data

(60) Continuation of application No. 16/432,651, filed on Jun. 5, 2019, now Pat. No. 10,734,735, which is a
(Continued)

(51) Int. Cl.
*H01Q 21/00*     (2006.01)
*H01Q 21/22*     (2006.01)
(Continued)

(52) U.S. Cl.
CPC ........... *H01Q 21/22* (2013.01); *G06K 19/077* (2013.01); *H01L 24/82* (2013.01);
(Continued)

(58) Field of Classification Search
CPC .... H01Q 21/0087; H01Q 21/22; H01Q 21/00; H01Q 21/0025; H01Q 21/0093;
(Continued)

(56) References Cited

U.S. PATENT DOCUMENTS

| | | | |
|---|---|---|---|
| 6,184,832 B1 | 2/2001 | Geyh et al. | |
| 7,095,372 B2 * | 8/2006 | Soler Castany | ......... H01Q 1/40 343/700 MS |

(Continued)

OTHER PUBLICATIONS

U.S. Appl. No. 14/104,296 U.S. Pat. No. 9,659,904, filed Dec. 12, 2013, Distributed On-Package Millimeter-Wave Radio.
(Continued)

*Primary Examiner* — Tho G Phan
(74) *Attorney, Agent, or Firm* — Schwegman Lundberg & Woessner, P.A.

(57) ABSTRACT

Embodiments described herein generally relate to phased array antenna systems or packages and techniques of making and using the systems and packages. A phased array antenna package may include a distributed phased array antenna comprising (1) a plurality of antenna sub-arrays, which may each include a plurality of antennas, (2) a plurality of Radio Frequency Dies (RFDs), each of the RFDs located proximate and electrically coupled by a trace of a plurality of traces to a corresponding antenna sub-array of the plurality of antenna sub-arrays, and (3) wherein each trace of the plurality of traces configured to electrically couple an antenna of the plurality of antennas to the RFD located proximate the antenna, wherein each trace of the plurality of traces is configured to transmit millimeter wave (mm-wave) radio signals, and wherein the plurality of traces are each of a substantially uniform length.

20 Claims, 7 Drawing Sheets

Related U.S. Application Data division of application No. 15/453,327, filed on Mar. 8, 2017, now Pat. No. 10,326,211, which is a division of application No. 14/104,296, filed on Dec. 12, 2013, now Pat. No. 9,659,904.

(51) Int. Cl.
| | | |
|---|---|---|
| *H01L 23/00* | (2006.01) | |
| *H01Q 21/06* | (2006.01) | |
| *H01Q 23/00* | (2006.01) | |
| *G06K 19/077* | (2006.01) | |

(52) U.S. Cl.
CPC ..... *H01Q 21/0025* (2013.01); *H01Q 21/0087* (2013.01); *H01Q 21/0093* (2013.01); *H01Q 21/065* (2013.01); *H01Q 23/00* (2013.01); *H01L 24/20* (2013.01); *H01L 2223/6677* (2013.01); *H01L 2224/16227* (2013.01); *H01L 2924/15153* (2013.01); *H01L 2924/15321* (2013.01)

(58) Field of Classification Search
CPC ........ H01Q 21/065; H01Q 23/00; H01Q 1/38; G06K 19/077; H01L 2223/6677; H01L 2224/16227; H01L 24/20; H01L 24/82; H01L 2924/15153; H01L 2924/15321
See application file for complete search history.

(56) References Cited

U.S. PATENT DOCUMENTS

| | | | |
|---|---|---|---|
| 7,728,774 B2 | 6/2010 | Akkermans et al. | |
| 7,852,281 B2 | 12/2010 | Choudhury | |
| 8,138,599 B2* | 3/2012 | Megahed | H01L 23/49838 257/723 |
| 8,854,277 B2* | 10/2014 | De Graauw | H01Q 23/00 343/904 |
| 9,196,951 B2* | 11/2015 | Baks | H01Q 1/2283 |
| 9,472,859 B2* | 10/2016 | Dang | H01Q 21/0075 |
| 9,659,904 B2* | 5/2017 | Kamgaing | H01L 24/82 |
| 9,680,232 B2* | 6/2017 | Markish | H01Q 21/067 |
| 9,773,742 B2* | 9/2017 | Kamgaing | H01L 23/49838 |
| 10,326,211 B2 | 6/2019 | Kamgaing et al. | |
| 10,734,735 B2* | 8/2020 | Kamgaing | H01Q 21/0087 |
| 2009/0231226 A1 | 9/2009 | Quan et al. | |
| 2012/0280380 A1 | 11/2012 | Kamgaing | |
| 2015/0171523 A1 | 6/2015 | Kamgaing et al. | |
| 2017/0179612 A1 | 6/2017 | Kamgaing et al. | |
| 2019/0288404 A1 | 9/2019 | Kamgaing et al. | |

OTHER PUBLICATIONS

U.S. Appl. No. 15/453,327 U.S. Pat. No. 10,326,211, filed Mar. 8, 2017, Distributed On-Package Millimeter-Wave Radio.
U.S. Appl. No. 16/432,651, filed Jun. 5, 2019, Distributed On-Package Millimeter-Wave Radio.
"U.S. Appl. No. 14/104,296, Examiner Interview Summary dated Jan. 21, 2016", 3 pgs.
"U.S. Appl. No. 14/104,296, Examiner Interview Summary dated May 4, 2016", 3 pgs.
"U.S. Appl. No. 14/104,296, Examiner Interview Summary dated Oct. 7, 2016", 3 pgs.
"U.S. Appl. No. 14/104,296, Final Office Action dated Apr. 6, 2016", 14 pgs.
"U.S. Appl. No. 14/104,296, Non Final Office Action dated Jul. 15, 2016", 16 pgs.
"U.S. Appl. No. 14/104,296, Non Final Office Action dated Nov. 9, 2015", 17 pgs.
"U.S. Appl. No. 14/104,296, Notice of Allowance dated Jan. 17, 2017", 12 pgs.
"U.S. Appl. No. 14/104,296, PTO Response to Rule 312 Communication dated Feb. 7, 2017", 2 pgs.
"U.S. Appl. No. 14/104,296, Response filed Jan. 14, 2016 to Non Final Office Action dated Nov. 9, 2015", 9 pgs.
"U.S. Appl. No. 14/104,296, Response filed Apr. 29, 2016 to Final Office Action dated Apr. 6, 2016", 9 pgs.
"U.S. Appl. No. 14/104,296, Response filed Oct. 4, 2016 to Non Final Office Action dated Jan. 15, 2016", 16 pgs.
"U.S. Appl. No. 15/453,327, Notice of Allowance dated Feb. 8, 2019", 8 pgs.
"U.S. Appl. No. 15/453,327, Response filed Jan. 3, 2019 to Restriction Requirement dated Oct. 3, 2018", 7 pgs.
"U.S. Appl. No. 15/453,327, Restriction Requirement dated Oct. 3, 2018", 5 pgs.
"U.S. Appl. No. 16/432,651, Non Final Office Action dated Dec. 2, 2019", 5 pgs.
"U.S. Appl. No. 16/432,651, Notice of Allowance dated Mar. 24, 2020", 5 pgs.
"U.S. Appl. No. 16/432,651, Response filed Feb. 25, 2020 to Non Final Office Action dated Dec. 2, 2019", 7 pgs.

* cited by examiner

DISTRIBUTED ON-PACKAGE MILLIMETER-WAVE RADIO

CROSS-REFERENCE TO RELATED APPLICATION

This application is a continuation of U.S. patent application Ser. No. 16/432,651, filed Jun. 5, 2019, which is a divisional of U.S. patent application Ser. No. 15/453,327, filed Mar. 8, 2017, now issued as U.S. Pat. No. 10,326,211, which is a divisional of U.S. patent application Ser. No. 14/104,296, filed Dec. 12, 2013, now issued as U.S. Pat. No. 9,659,904, which is incorporated by reference herein in its entirety.

TECHNICAL FIELD

Embodiments described herein generally relate to phased array antenna packages and systems and techniques of making and using the phased array antenna packages and systems. More specifically embodiments discussed herein relate to distributed or phased array antenna packages.

BACKGROUND

Demand for information technology devices is constantly growing. Such devices can be equipped with wireless technologies. There is currently a demand for increased performance from these wireless technologies. The demand and general prevalence of the devices has created crowding in the Electro-Magnetic (EM) spectrum. This crowding may be related to EM spectrum partitioning. As more bandwidths are used, there may be fewer available channels. There may be an increasing demand for high-bandwidth usage (e.g., streaming high-definition video to a cellular device). Existing technologies, which allow for such high-bandwidth usage, may reach unsustainable levels of demand and usage. The fact that these technologies, such as Long Term Evolution (LTE) networks, operate on a relatively limited partition of the EM spectrum can magnify these problems. Efficient radio communication in its current state may not be sustainable using current techniques.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DESCRIPTION OF EMBODIMENTS

Figure 1:
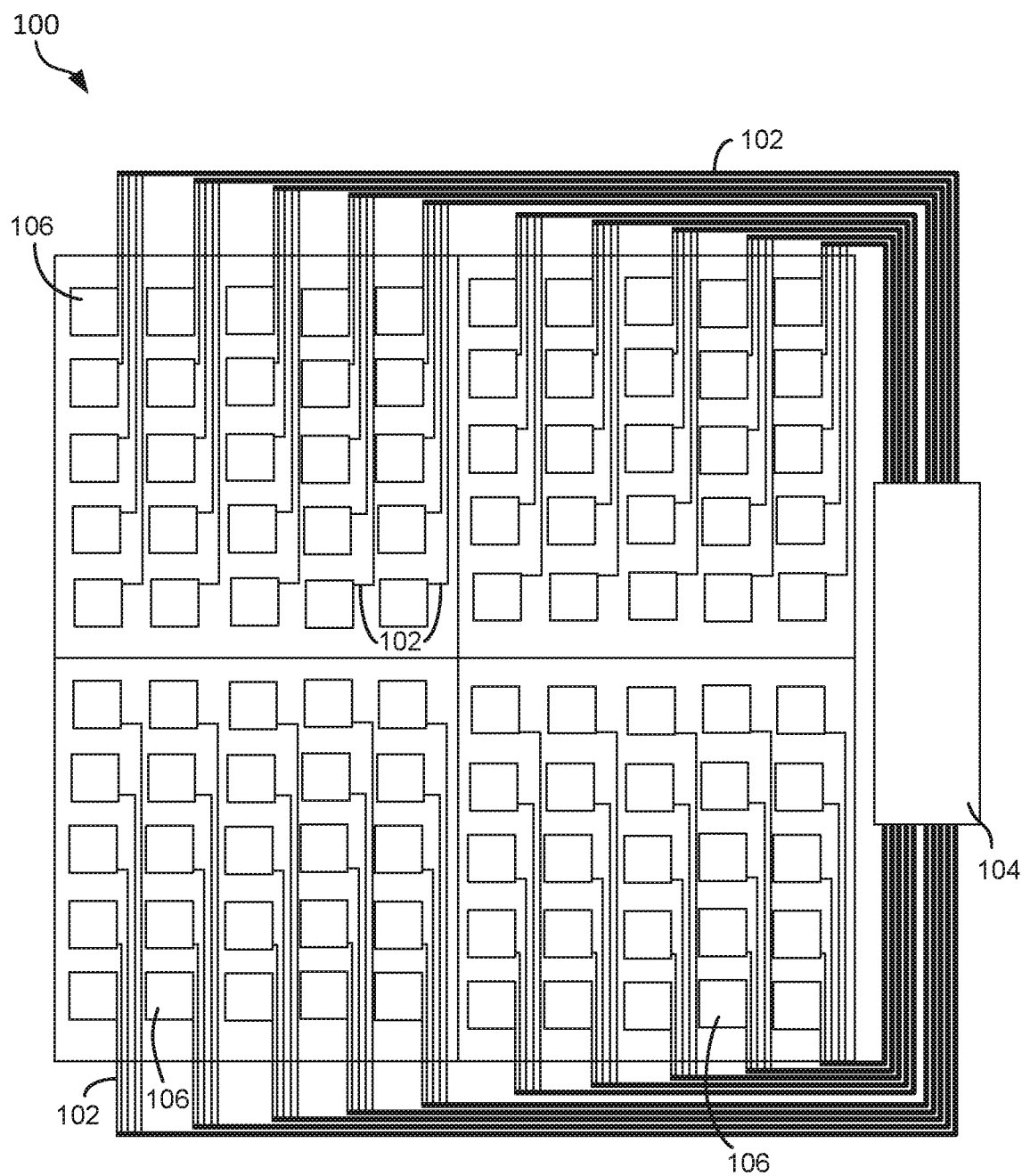
FIG. 1 illustrates an example of an antenna array

Examples in this disclosure relate to packages and systems for phased array antennas and the related parts of these packages and systems. Examples also relate to techniques of using and making the packages and systems.

The following description may include terms, such as upper, lower, first, second, etc. that are used for descriptive purposes only and are not to be construed as limiting. The examples of an apparatus or article described herein may be manufactured, used, or shipped in a number of positions and orientations. The terms "die" generally refers to the physical object that is the basic work piece that is transformed by various process operations into the desired integrated circuit device. A die is usually singulated from a wafer and wafers may be made of semiconducting, non-semiconducting, or combinations of semiconducting and non-semiconducting materials.

As used herein, "higher frequency" and "lower frequency" are defined in relativistic terms. They are also defined in contrasting pairs. Therefore, "higher frequency" is defined a as being a greater frequency (measured in Hz) as compared to its "lower frequency" counterpart, which is defined as less than its "higher frequency" counterpart. Thus, these definitions are inherently general and should not be taken to refer to any particular segment of the EM or other spectrum, or any particular Hertz values.

As used herein, "low frequency" means the range of frequencies from DC (0 Hz) to, but not including, 3 MHz. "High frequency" is defined as the range of frequencies from 3 MHz and greater.

As a result of many factors, including those discussed in the background section, the range of the EM spectrum being used for data transfer has now risen to millimeter-wave frequencies of ~30-~300 GHz. 300 GHz may be a limit on various forms of radio communication as the EM waves in this range of the spectrum may become a form of near infrared light at or near this frequency. The segment of the spectrum (~30-~300 GHz) is alternatively referenced as either Extremely High Frequency (EHF) or millimeter-wave (mm-wave), among others. An EM wave in the mm-wave range of the spectrum may have a wavelength ($\lambda$) value ranging from about 1 mm to about 10 mm.

Signals with mm-wave frequencies may be used to help achieve a high bandwidth transmission. However, in this higher range of the radio portion of the Electro-Magnetic (EM) spectrum (~30-~300 GHz), various difficulties experienced by transmissions over traces at these higher frequencies may become more pronounced as compared to lower frequencies. Difficulties may include transmission losses, signal degradation, parasitic capacitance or inductance, and the like. Such difficulties may be so pronounced that an effective ceiling may be placed on the useful size and maximum speed of a phased array antenna using a single radio frequency die (RFD) or similar die.

A higher frequency transmission may experience substantially more resistance than a lower frequency transmission on a similar trace or wire. Thus, it may be advantageous to use lower frequency signals, in contrast to higher frequency signals, where possible. Generally speaking, a larger phased array antenna with ideal non-lossy signal traces between the radio frequency die and the antenna elements will have higher throughput than a smaller phased array antenna with non-lossy traces between the radio frequency die and the antenna elements. However, a countervailing factor of trace length serves to at least partially offset the gains of a larger phased array antenna.

A phased array antenna module on package may be created by incorporating a number of components, such as antennas, traces, or multiple RFDs therein. Additionally, components such as resistors, capacitors, inductors and crystal oscillators may be included on the package to complement the RF circuitries. The package may be coupled to a logic die or baseband (hereinafter referred to as a logic die), such as by coupling the multiple RFDs to the logic die. The logic die may be external to the phased array antenna package. The phased array antenna package can include a plurality of RFDs and their corresponding antennas sub-arrays and corresponding electrical couplings (e.g., traces, vias, bond pads, wires, or other electrical couplings).

As used herein, a "distributed" architecture is distinct from a "partitioned" architecture. A distributed architecture implements a single function, while a partitioned architecture implements multiple functions. For example, a distributed architecture may be implemented by replacing a single RFD with multiple RFDs of the same function, i.e., wavelength capability. A partitioned architecture, on the other hand, already includes multiple RFDs, where each RFD is dedicated to a different function. For example, a partitioned array may include a first RFD dedicated to receiving high frequency signals from a first array of antennas and a second RFD dedicated to receiving low frequency signals from a second array of antennas. In one embodiment of the invention, either function (e.g., the high or low frequency processing) in the partitioned architecture can be made distributed by replacing the respective RFD with multiple RFDs and adding some processing circuitry. In one example, the partitioned architecture the first RFD could be replaced with multiple RFDs to create a hybrid-distributed-partitioned architecture.

This disclosure describes various structures and techniques that may include a plurality of RFDs configured in a distributed architecture, such as in a phased array antenna package. A possible benefit of having one package with multiple RFDs may be shorter traces carrying high-frequency signals as compared with a package or antenna array with a single RFD. A multiple-RFD package may include proportionately longer traces carrying low-frequency signals or DC electricity as compared to traces carrying high-frequency signals.

As used herein, "data center" refers to a facility used to house computer systems and associated components. For example, telecommunications and storage systems. A data center may contain a plurality of individual computing units, such as server blades, which are stacked, assembled, or otherwise situated on multiple racks. The proposed distributed phased array is electronically steerable and maybe used as point to point or point to multipoint data link within a rack or between racks.

Various distributed array structures herein may be used as possible replacements for Wireless Fidelity (Wi-Fi) in small cells of future LTE cellular networks. The cellular tower may, for example, provide signal to many small cells and the end user may communicate directly with the small cells at a much higher data rate. The small cells may be implemented over distances of about 100 meters.

As used herein, male or female connection features may refer to, for example, Land Grid Array (LGA) pin-type connection features, Ball Grid Array (BGA) solder-ball-type connection features, or other similar connection features.

Reference will now be made to the drawings wherein like structures will be provided with like suffix reference designations. In order to show the structures of various examples clearly, the drawings included herein are diagrammatic representations of integrated circuit structures and systems related thereto, and are not necessarily drawn to scale. Thus, the actual appearance of the fabricated structures, for example in a photomicrograph, may appear different while still incorporating subject matter of the illustrated examples. Moreover, the drawings show the structures to aid in understanding the illustrated examples.

FIG. 1 illustrates an example of a current antenna array package 100. The phased array antenna package 100 includes a plurality of antennas 106, a system on chip (SoC) die 104, and traces 102. A trace 102 may electrically couple an SoC die 104 to each individual antenna 106 on the package 100. This high-frequency transmission carried on the traces may then be transmitted to the SoC die 104. Each SoC die 104 may contain both radio and logic circuitries.

Antenna array 100 in this example (FIG. 1) contains one hundred (100) antennas 106, each individually electrically coupled via trace 102 to SoC die 104. These antennas 106 may be configured to transmit or receive high-frequency signals. There may be signal losses along the traces 102. These signal losses may be exacerbated by a potential requirement of all traces having virtually the same length. Thus, as the phased array antenna 100 is scaled up to create a larger array of antennas 106, transmission efficiency may accordingly be reduced because the trace length will likely be required to be longer.

Utilizing these traces 102 to carry the high-frequency transmissions from the antenna 106 to the SoC die 104 may be relatively efficient at short distances. The efficiency may decrease as the size of an antenna 106 array increases or is otherwise scaled up, such as to increase the length of the traces 102, such as to suit various needs. In general, as the size of the antenna 106 array increases, the length of traces increases to accompany more antennas 106. Scaling up the size of the antenna 106 array, while using a single SoC die 104 connected to all the antennas 106, may lead to difficulties, such as previously discussed.

Figure 2A:
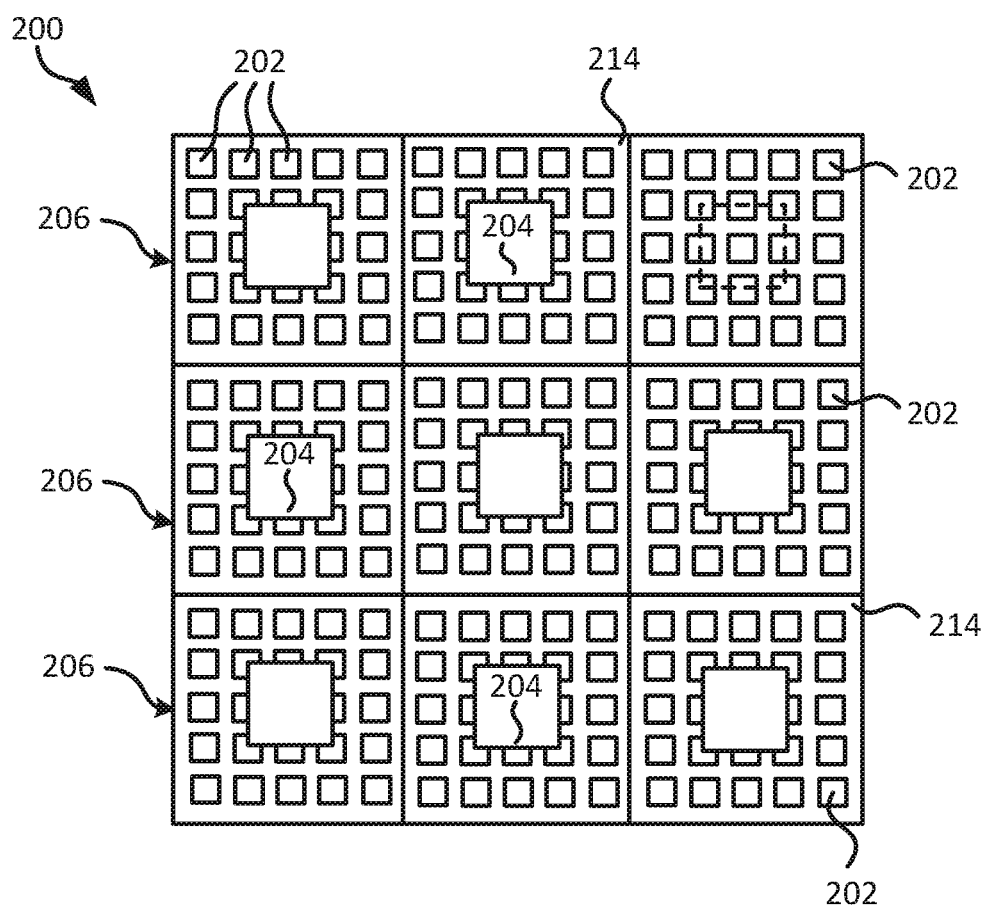
FIG. 2A illustrates an example of a phased array antenna package.

FIG. 2A shows an example of a phased array antenna package 200. The package 200 may include a plurality of antennas 202, a plurality of phased antenna sub-arrays 206, or a plurality of RFDs 204. The antennas 202, sub-arrays 206 and RFDs 204 may be situated on or at least partially in a dielectric substrate 214. One RFD 204 in FIG. 2A is shown as transparent (in dashed lines) to show the antenna situated underneath the RFD 204.

The antennas 202 may be designed to receive high-frequency radio signals (e.g., waves). Antennas 202 may include, for example, package integrated planar antennas, such as single or multilayer patch antennas, or slot antennas. The high-frequency radio waves may be mm-waves.

Figure 2B:
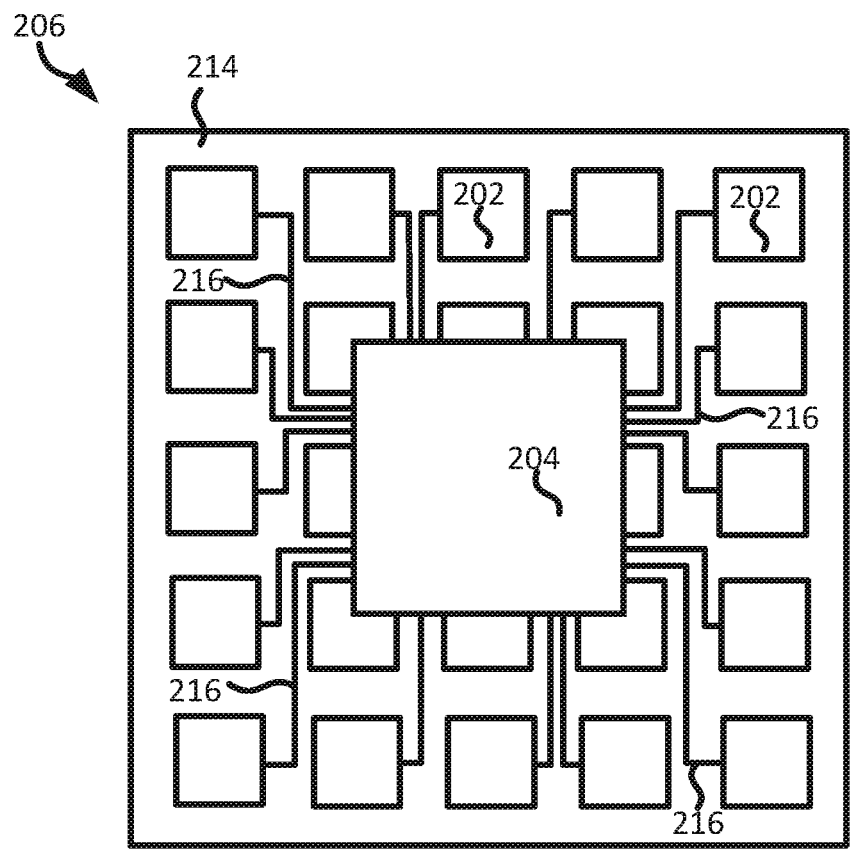
FIG. 2B illustrates an example of a sub-array of a phased array antenna package.

The antennas 202 may be arranged into one or more phased antenna sub-arrays 206. The phased sub-arrays 206 may each include a plurality of individual antennas 202. Each phased antenna sub-array 206 may, for example, be arranged in a variety of configurations. Various configurations of antennas 202 may be various patterns or layouts. The layout shown in FIGS. 2A and 2B is a rectangular layout. However, other layouts are also within the scope of this disclosure. For example, a triangular, hexagonal, tetrahedral, circular, linear or a combination thereof may be used.

An individual RFD 204 may be located proximate each antenna 202 or each phased antenna sub-array 206. The RFD 204 may be electrically coupled to each antenna 202 in the proximate antenna sub-array 206 (See FIG. 2B for a view of an example of the electrical coupling).

FIG. 2B shows a close-up of the phased antenna sub-array 206, the antennas 202, RFD 204, substrate 214, and one or more traces 216. The traces 216 may electrically couple the RFD 204 to the antennas 202. The traces 216 may be configured to carry high-frequency radio signals. The routing of traces 216 may be co-planar or non-co-planar with other components in the package 200. Co-planar routing may include routing traces 216 on a same layer of the substrate 214 as the RFD 204 or the antennas 202. Non co-planar routing may include routing traces 216 on a different layer of the substrate 214 than the RFD 204 or the antennas 202. The antennas may be implemented on one or more layers of the multilayer package substrate.

Figure 3:
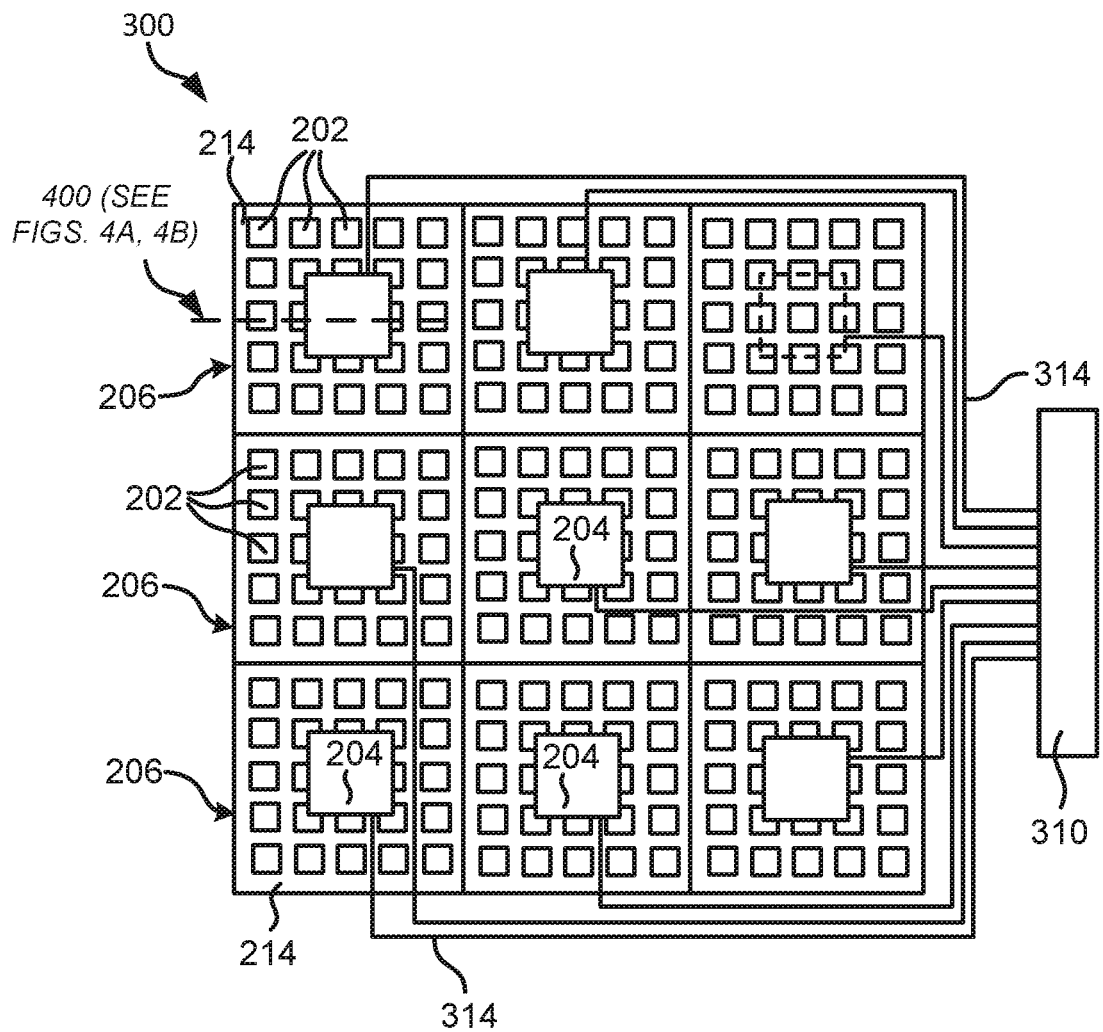
FIG. 3 illustrates an example of a phased array antenna package system.

FIG. 3 shows a system 300, which may comprise components substantially similar to the components of package 200 and including a logic die 310 coupled to the RFDs 204. The logic die 310 can be electrically coupled (e.g., such as through traces 314) or communicatively coupled (e.g., through a wireless connection) to the RFDs 204.

The logic die 310 may be located outside of substrate 214 or its related package. The logic die 310 may receive signals from the RFDs 204, or send signals to the RFDs 204. The logic die 310, if receiving signals from the RFDs 204, may process these signals for output to various other apparatuses or systems. If the logic die 310 is to output signals to the RFDs 204, then the logic die may receive signals from various other apparatuses or systems. When (e.g., at or around the time) the logic die 310 has received these signals, it may send the signals to the RFDs 204.

The traces 314 may electrically couple the logic die 310 to a respective RFD 204. In the system 300 of FIG. 3, nine (9) RFDs 204 are shown coupled to the logic die 310 through nine respective traces 314. The traces 314 may be configured (e.g., the width, depth, or length of the traces may be configured) to carry DC or low-frequency signals, such as to account for the power of the signals transmitted through the traces 314.

Package architectures disclosed in FIG. 2A, 2B or 3 may produce less concentrated or localized heat, compared to single RFD packages, such as shown FIG. 1. The less concentrated or localized heat may result from high-frequency traces running relatively shorter distances, compared to single RFD array solution. By decentralizing RFDs, the heat produced by the ensemble of all RFDs may be more easily dispersed or dissipated, such as through convection. Heat created may also be more decentralized when compared to a single RFD array solution, such as shown in FIG. 1. For instance, in FIG. 1, the RFD 104 is the only RFD 104 in the system. By contrast, FIG. 3 shows a plurality of nine (9) RFDs 204, dividing and delegating processing power over nine (9) dies instead of one. Multiple RFDs may divide a total heat created in such RFDs 204 over a greater overall area.

The logic die 310 and package 200 may also be assembled, for example, as separate packages on a single system board (not shown in FIGS.).

Figure 4A:
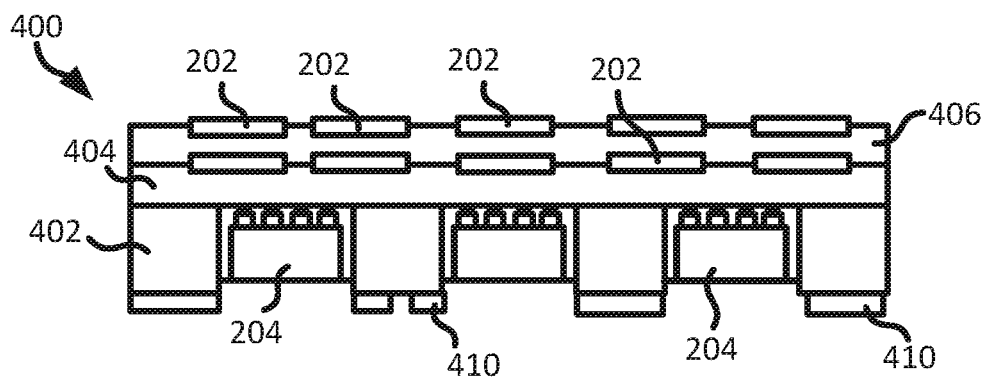
FIG. 4A illustrates a cross-sectional view of the phased array antenna package system shown in FIG. 3.

FIG. 4A is a cross-section view of a Bumpless Build-Up Layer (BBUL) phased array antenna package 400. The phased array antenna package 400 may include items substantially similar to the items in the package 200. The phased array antenna package 400 may include the antennas 202, the RFDs 204, or one or more male or female connection features 410. The package 400 can include one or more build-up layers 402, 404, or 406 (e.g., Ajinomoto build-up layers).

One or more of the RFDs 204 can be embedded, at least partially, in a build-up layer, such as build-up layer 402 as shown in FIG. 4A. One or more antennas 202 can be situated on or at least partially in a build-up layer, such as build-up layer 404 or 406 as shown in FIG. 4A. The RFDs 204 can be electrically coupled (e.g., through traces, vias, bond pads, or a combination thereof, not shown in FIG. 4A) to one or more proximate antennas 202 or all the antennas 202 of a proximate antenna sub-array 206 (electrical coupling and antenna array not shown in FIG. 4A).

Though not shown in the FIGS., various other methods, such as flip-chipping may also be used to assemble the die to the package.

The male or female connection features 410 can be configured to electrically or mechanically couple to corresponding female or male connection features (not shown in FIG. 4A), such as female or male connection features of a logic board, logic die package, printed circuit board, connector, or other connecting mechanism capable of coupling the RFDs 204 to the logic die 310. The male or female connection features 410 may be, for example, Land Grid Array (LGA) connection features.

The RFDs 204 may be situated on or at least partially in a different build-up layer 402 as the antennas 202 (e.g., build-up layer 404 or 406). The build-up layer 404 may be situated on build-up layer 402. The build-up layer 406 may be situated on the build-up layer 404.

Figure 4B:
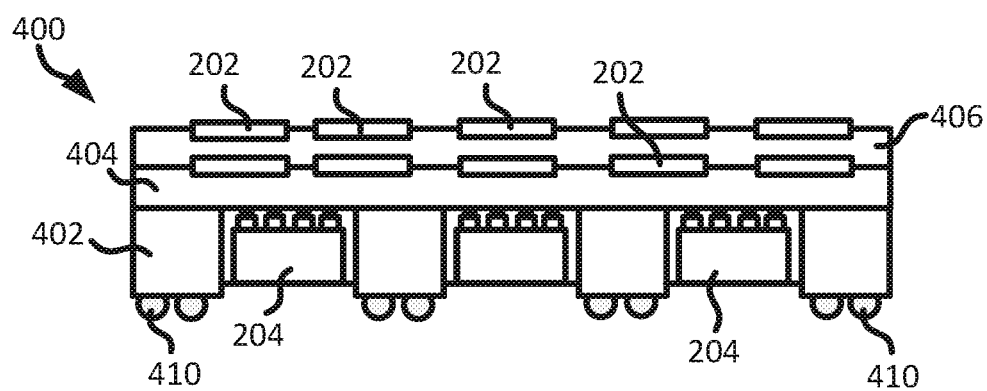
FIG. 4B illustrates another cross-sectional view of the phased array antenna package system shown in FIG. 3.

FIG. 4B is a cross-section view of a Bumpless Build-Up Layer (BBUL) phased array antenna package 400. The phased array antenna package 400 may include items substantially similar to the items in the package 200. The phased array antenna package 400 may include the antennas 202, the RFDs 204, or one or more male or female connection features 410. The package 400 can include one or more build-up layers 402, 404, or 406 (e.g., Ajinomoto build-up layers).

One or more of the RFDs 204 can be embedded, at least partially, in a build-up layer, such as build-up layer 402 as shown in FIG. 4B. One or more antennas 202 can be situated on or at least partially in a build-up layer, such as build-up layer 404 or 406 as shown in FIG. 4B. The RFDs 204 can be electrically coupled (e.g., through traces, vias, bond pads, or a combination thereof, not shown in FIG. 4B) to one or more proximate antennas 202 or all the antennas 202 of a proximate antenna sub-array 206 (electrical coupling and antenna array not shown in FIG. 4B).

Though not shown in the FIGS., various other methods, such as flip-chipping may also be used to assemble the die to the package.

The male or female connection features 410 can be configured to electrically or mechanically couple to corresponding female or male connection features (not shown in FIG. 4B), such as female or male connection features of a logic board, logic die package, printed circuit board, connector, or other connecting mechanism capable of coupling the RFDs 204 to the logic die 310. The male or female connection features 410 may be Ball Grid Array (BGA) connection features, e.g., solder balls.

The RFDs 204 may be situated on or at least partially in a different build-up layer 402 as the antennas 202 (e.g., build-up layer 404 or 406). The build-up layer 404 may be situated on build-up layer 402. The build-up layer 406 may be situated on the build-up layer 404.

Figure 5:
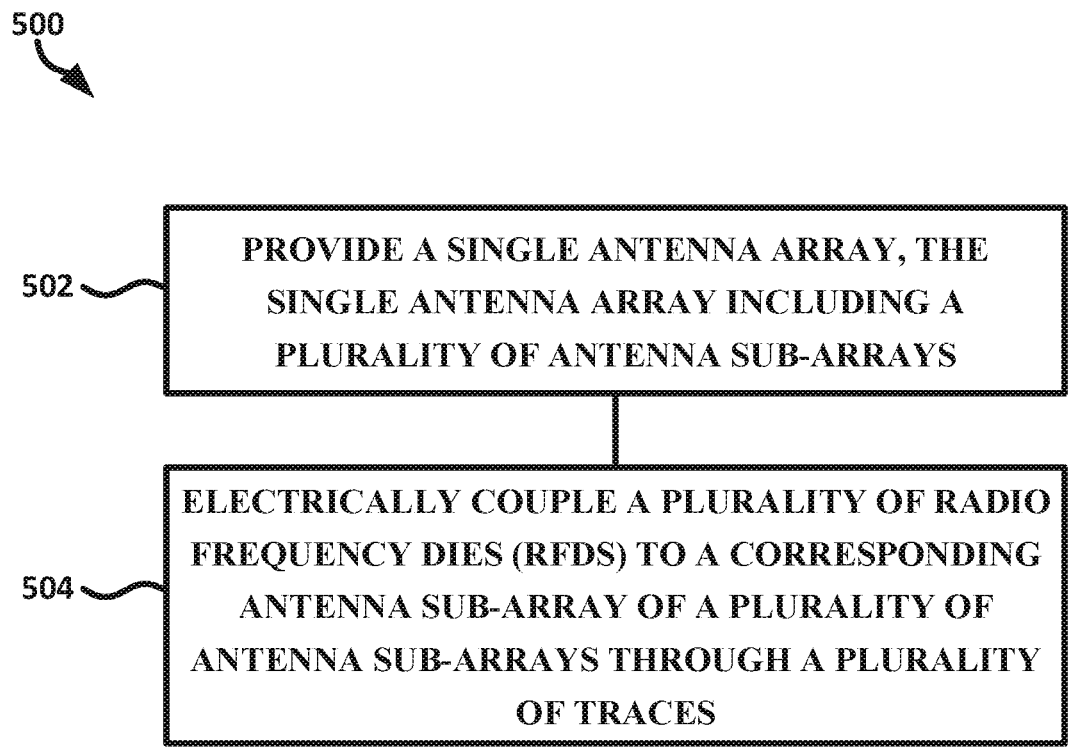
FIG. 5 illustrates an example of a technique of making a phased array antenna package.

FIG. 5 illustrates a flow diagram of a technique 500 of making a device according to an example embodiment. At 502, a single antenna array may be provided, the single antenna array including a plurality of antenna sub-arrays 206. Providing the single antenna array may include providing the single antenna array in a configuration chosen from the group consisting of a rectangular configuration, a hexagonal configuration, a triangular configuration, a tetrahedral, circular, linear configuration and a combination thereof.

At 504, a plurality of Radio Frequency Dies (RFDs) 204 may be coupled to a corresponding antenna sub-array 206 of the plurality of antenna sub-arrays 206 through a plurality of traces 216. Each trace of the plurality of traces 216 electrically couples an antenna 202 of the plurality of antennas to the RFD 204 located proximate the antenna 202, wherein each trace of the plurality of traces 216 is configured to transmit millimeter wave radio signals, and wherein the plurality of traces 216 are each of a substantially uniform length, that is, the maximum difference in length between traces 216 may be no more than two wavelengths of a signal being carried by the traces 216. The technique 500 may include situating a plurality of male or female connection features on the package, the male or female connection features configured to couple to female or male connection features on a logic die.

Figure 6:
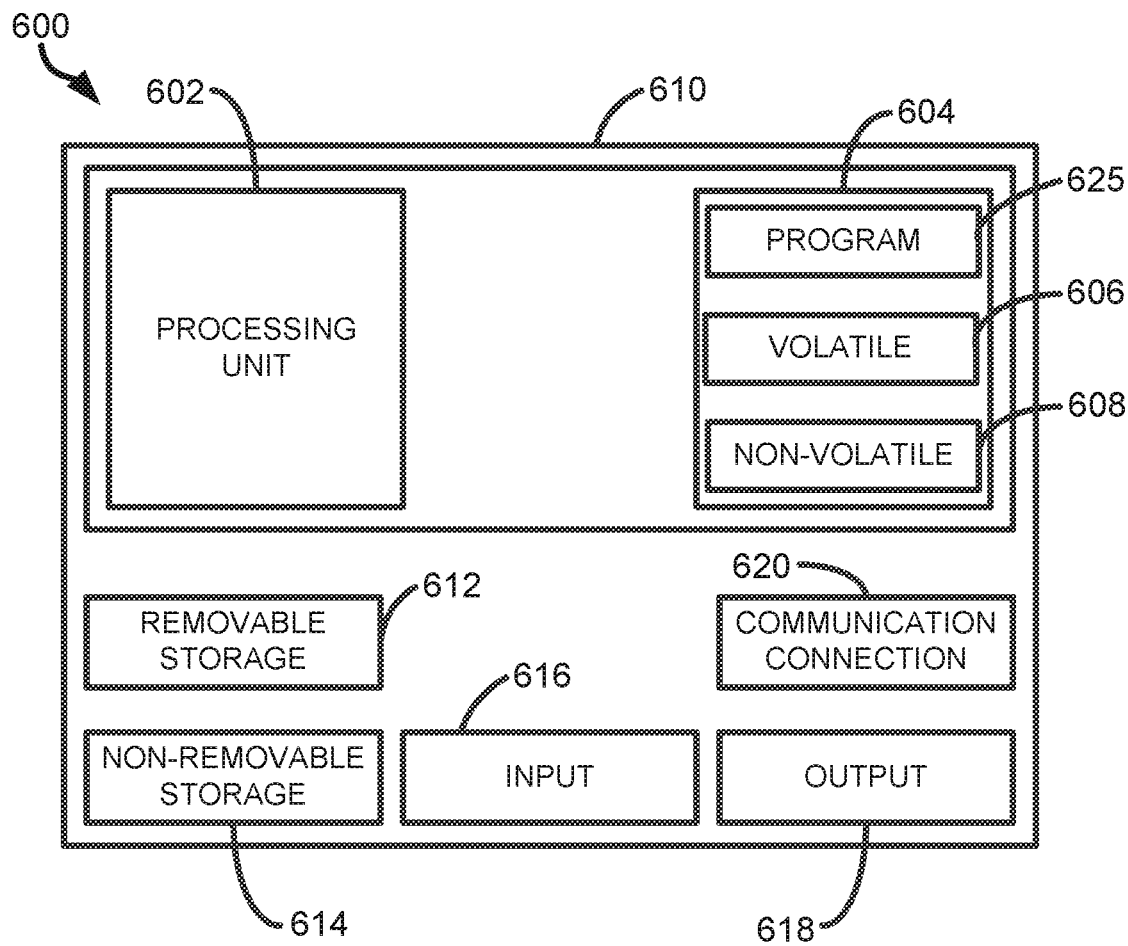
FIG. 6 is a schematic of an example of an electronic system.

FIG. 6 is an example computer system 600 machine upon which any one or more of the techniques herein discussed may be run. Such a computer system 600 may be implemented in the various packages or systems described herein. Computer system 600 may be a computer device, such as may include a phased array antenna package or system as described herein. In an example, the machine may operate as a standalone device or may be connected (e.g., via a cellular network) to other machines. In a networked deployment, the machine may operate in the capacity of either a server or a client machine in server-client network environments, or it may act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 600 may include a processing unit 602 (e.g., a Central Processing Unit (CPU), a Graphics Processing Unit (GPU) or both), program memory 604, a volatile memory 606 and a non-volatile memory 608, which communicate with each other via interconnect (e.g., a link, bus, etc.) (not shown). The computer system 600 may additionally include a non-removable storage device 614 (e.g., a drive unit), a removable storage device 612 (e.g., an optical disc drive) an output controller 618, a power management controller (not shown), and a communication connection 620 (which may include or operably communicate with one or more antennas (not shown), transceivers, or other wireless communications hardware).

The non-removable storage device 614 and removable storage device 612 may include a machine-readable mediums on which may be stored one or more sets of data structures and instructions (e.g., software) embodying or utilized by any one or more of the methodologies or functions described herein. The instructions may also reside, completely or at least partially, within the program memory 604, volatile memory 606, non-volatile memory 608, or within the processor 602 during execution thereof by the computer system 600, with the program memory 604, volatile memory 606, non-volatile memory 608, and the processor 602 also constituting machine-readable media.

VARIOUS NOTES AND EXAMPLES

The present subject matter may be described by way of several examples.

Example 1 may include or use subject matter (such as an apparatus, a method, a means for performing acts, or a device readable memory including instruction that, when performed by the device, may cause the device to perform acts), such as may include or use a package, which may include a distributed phased array antenna including a plurality of antenna sub-arrays, which may include a plurality of antennas; a plurality of Radio Frequency Dies (RFDs), each of the RFDs located proximate and electrically coupled by a plurality of traces to a corresponding antenna sub-array; and wherein each trace of the plurality of traces configured to electrically couple an antenna of the plurality of antennas to the RFD located proximate the antenna, wherein each trace of the plurality of traces is configured to transmit millimeter wave (mm-wave) radio signals, and wherein the maximum difference in length between traces is no more than two wavelengths of a signal being carried by the traces.

Example 2 may include or use, or may optionally be combined with the subject matter of Example 1, wherein each antenna sub-array is coupled to exactly one proximate RFD.

Example 3 may include or use, or may optionally be combined with the subject matter of at least one of Examples 1-2, wherein the antenna sub-arrays are laid out in a rectangular configuration.

Example 4 may include or use, or may optionally be combined with the subject matter of at least one of Examples 1-3, wherein the package is a Bumpless Build-Up Layer (BBUL) package.

Example 5 may include or use, or may optionally be combined with the subject matter of at least one of Examples 1-4, wherein the plurality of traces are principally located on a layer of the BBUL package other than the layer on which the RFDs are located.

Example 6 may include or use, or may optionally be combined with the subject matter of at least one of Examples 1-5, wherein the plurality of traces are principally located on a layer of the BBUL package other than the layer on which the antenna sub-arrays are located.

Example 7 may include or use, or may optionally be combined with the subject matter of at least one of Examples 1-6, and may further include a plurality of male or female connection features configured to couple to female or male connection features on a logic die.

Example 8 may include or use subject matter (such as an apparatus, a method, a means for performing acts, or a device readable memory including instruction that, when performed by the device, may cause the device to perform acts), or may optionally be combined with the subject matter of at least one of Examples 1-7, such as may include or use a technique of making a distributed phased array antenna package, providing a single antenna array, the single antenna array including a plurality of antenna sub-arrays, which may include electrically coupling a plurality of Radio Frequency Dies (RFDs) to a corresponding antenna sub-array of a plurality of antenna sub-arrays through a plurality of traces; and wherein, each trace of the plurality of traces electrically couples an antenna of a sub-array to the RFD located proximate the antenna, wherein each trace is configured to transmit millimeter wave radio signals, and wherein a maximum difference in length between traces is no more than two wavelengths of a signal being carried by the traces.

Example 9 may include or use, or can optionally be combined with the subject matter of at least one of Examples 1-8, wherein providing a single antenna array configuration includes providing the antenna sub-arrays in a rectangular configuration.

Example 10 may include or use, or can optionally be combined with the subject matter of at least one of Examples 1-9, and may further include situating a plurality of male or female connection features on the package, the male or female connection features configured to couple to female or male connection features on a logic die.

Example 11 may include or use, or can optionally be combined with the subject matter of at least one of Examples 1-10, and may further include assembling the phased array antenna package as a Bumpless Build-Up Layer (BBUL) package.

Example 12 may include or use, or can optionally be combined with the subject matter of at least one of Examples 1-11, wherein the BBUL package is assembled using a plurality of Ajinomoto build-up layers.

Example 13 may include or use, or can optionally be combined with the subject matter of at least one of Examples 1-12, wherein assembling the BBUL package includes situating the plurality of traces principally on a first build-up layer of the plurality of Ajinomoto build-up layers and situating the RFDs on a second build-up layer of the plurality of Ajinomoto build-up layers.

Example 14 may include or use, or can optionally be combined with the subject matter of at least one of Examples 1-13, wherein assembling the BBUL package includes situating the plurality of traces principally on a first build-up layer of the plurality of Ajinomoto build-up layers and situating the antenna sub-arrays on a second build-up layer of the plurality of Ajinomoto build-up layers.

Example 15 may include or use subject matter (such as an apparatus, a method, a means for performing acts, or a device readable memory including instruction that, when performed by the device, may cause the device to perform acts), or can optionally be combined with the subject matter of at least one of Examples 1-14, such as may include or use a distributed antenna array package, which may include a single phased array device, which may further include a single antenna array, which may include a plurality of Radio Frequency Dies (RFDs), each the RFDs located proximate and electrically coupled by a plurality of traces to a sub-array of antennas of the single antenna array, and wherein each trace of the plurality of traces is configured to electrically couple an antenna of a sub-array to an RFD located proximate the sub-array, wherein each trace of the plurality of traces is configured to transmit millimeter wave radio signals, and wherein a maximum difference in length between traces is no more than two wavelengths of a signal being carried by the traces.

Example 16 may include or use, or can optionally be combined with the subject matter of at least one of Examples 1-15, wherein the antenna sub-arrays are laid out in a rectangular configuration.

Example 17 may include or use, or can optionally be combined with the subject matter of at least one of Examples 1-16, wherein the package is a Bumpless Build-Up Layer (BBUL) package.

Example 18 may include or use subject matter (such as an apparatus, a method, a means for performing acts, or a device readable memory including instruction that, when performed by the device, may cause the device to perform acts), or can optionally be combined with the subject matter of at least one of Examples 1-17, such as may include or use a system, which may include a package, which may include a distributed phased array antenna, which may include a plurality of antenna sub-arrays, which may include a plurality of antennas; a plurality of Radio Frequency Dies (RFDs), each of the RFDs located proximate and electrically coupled to a corresponding antenna sub-array; wherein each trace of the plurality of traces is configured to electrically couple an antenna of the plurality of antennas to the RFD located proximate the antenna, wherein each trace of the plurality of traces is configured to transmit millimeter wave (mm-wave) radio signals, and wherein the maximum difference in length between traces is no more than two wavelengths of a signal being carried by the traces; and a logic die, electrically coupled to each RFD, the logic die configured to send or receive DC or low-frequency signals to or from the package.

Example 19 may include or use, or can optionally be combined with the subject matter of at least one of Examples 1-18, wherein each antenna sub-array is coupled to exactly one proximate RFD.

Example 20 may include or use, or can optionally be combined with the subject matter of at least one of Examples 1-19, wherein the package and the logic die together form a single package.

Example 21 may include or use, or can optionally be combined with the subject matter of at least one of Examples 1-20, wherein each RFD of the plurality of RFDs is a mm-wave RFD.

Example 22 may include or use, or can optionally be combined with the subject matter of at least one of Examples 1-21, wherein the package is a Bumpless Build-Up Layer (BBUL) package.

Example 23 may include or use, or can optionally be combined with the subject matter of at least one of Examples 1-22, wherein the plurality of traces are principally located on a layer of the BBUL package other than the layer on which the RFDs are located.

Example 24 may include or use, or can optionally be combined with the subject matter of at least one of Examples 1-23, wherein the plurality of traces are principally located on a layer of the BBUL package other than the layer on which the antenna sub-arrays are located.

Example 25 may include or use, or can optionally be combined with the subject matter of at least one of Examples 1-24, which may further include a plurality of male or female connection features configured to couple to female or male connection features on a logic die.

Example 26 may include or use, or can optionally be combined with the subject matter of at least one of Examples 1-25, wherein the system may be a server blade.

Each of these non-limiting examples may stand on its own, or may be combined in various permutations or combinations with one or more of the other examples.

The above detailed description includes references to the accompanying drawings, which form a part of the detailed description. The drawings show, by way of illustration, specific embodiments in which methods, apparatuses, and systems discussed herein may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A semiconductor package comprising:
   an antenna array, the antenna array including first and second antenna sub-arrays;
   first and second radio dies; and
   a plurality of traces respectively electrically coupling an antenna of the antenna array to one of either the first radio die or the second radio die,
   each antenna of the antenna array is electrically coupled, via a trace of the traces, to the radio die of the first and second radio dies situated most proximate the antenna.

2. The semiconductor package of claim 1, further comprising:
   a stack of dielectric layers; and
   wherein each sub-array of the first plurality of antenna sub-arrays is situated on or at least partially in the stack of dielectric layers; and
   wherein the traces are situated on or at least partially in the stack of dielectric layers.

3. The semiconductor package of claim 2, wherein the stack of dielectric layers include:
   a first dielectric layer;
   a second dielectric layer in contact with the first dielectric layer;
   a third dielectric layer in contact with the second dielectric layer; and
   a fourth dielectric layer in contact with the third dielectric layer.

4. The semiconductor package of claim 3, wherein each sub-array of the first plurality of antenna sub-arrays situated on or at least partially in the first dielectric layer and the second dielectric layer, and the traces are situated on or at least partially in the third dielectric layer.

5. The semiconductor package of claim 1, wherein a maximum difference in a length of the traces is no more than two wavelengths of a signal being carried by the traces.

6. The package of claim 1, wherein each antenna sub-array is coupled to exactly one proximate radio die.

7. The package of claim 1, wherein the antenna sub-arrays are laid out in a rectangular configuration.

8. The package of claim 1, further comprising a plurality of male or female connection features configured to couple to female or male connection features on a logic die package.

9. A distributed antenna array package comprising:
   a single antenna array comprising a plurality of antenna sub-arrays including a first antenna sub-array and a second antenna sub-array, the plurality of antenna sub-arrays situated on or at least partially in first and second dielectric layers of the package;
   a plurality of traces situated on or at least partially in a third dielectric layer of the package; and
   a plurality of radio dies including a first radio die and a second radio die, each antenna sub-array of the antenna sub-arrays electrically coupled by traces of the plurality of traces to a radio die of the radio dies that is most proximate the antenna sub-array.

10. The distributed antenna array package of claim 9, wherein the radio dies are situated at least partially in a fourth dielectric layer of the package.

11. The distributed antenna array package of claim 9, wherein the first radio die is situated within a footprint of the first antenna sub-array and electrically coupled to each of the antennas of the first antenna sub-array through first traces of the plurality of traces.

12. The distributed antenna array package of claim 11, wherein the second radio die is situated within a footprint of the second antenna sub-array and electrically coupled to each of the antennas of the first antenna sub-array through second traces of the plurality of traces.

13. The distributed antenna array package of claim 9, wherein each trace of the plurality of traces is configured to electrically couple an antenna of a sub-array to a radio die located most proximate the sub-array.

14. The distributed antenna array package of claim 9, wherein each trace of the plurality of traces is configured to transmit millimeter wave (mm-wave) radio signals.

15. The distributed antenna array package of claim 9, wherein a maximum difference in length of the plurality of traces is no more than two wavelengths of a signal being carried by the traces.

16. The package of claim 15, wherein the antenna sub-arrays are laid out in a rectangular configuration.

17. A system comprising:
   a semiconductor package comprising:
   a distributed phased array antenna comprising:
   a plurality of antenna sub-arrays, each sub-array comprising a plurality of antennas, the plurality of antenna sub-arrays situated on or at least partially in first and second dielectric layers of the package; and
   a plurality of traces situated on or at least partially in a third dielectric layer of the package; and
   a plurality of radio dies including a first radio die and a second radio die, each antenna sub-array of the antenna sub-arrays electrically coupled by traces of the plurality of traces to a radio die of the radio dies that is most proximate the antenna sub-array.

18. The system of claim 17, wherein the radio dies are situated at least partially in a fourth dielectric layer of the package, the first radio die situated within a footprint of a first antenna sub-array of the antenna sub-arrays and electrically coupled to each of the antennas of the first antenna sub-array through first traces of the plurality of traces and the second radio die situated within a footprint of a second antenna sub-array of the antenna sub-arrays and electrically coupled to each of the antennas of the first antenna sub-array through second traces of the plurality of traces.

19. The system of claim 17, wherein each trace of the plurality of traces is configured to transmit millimeter wave (mm-wave) radio.

20. The system of claim 17, further comprising a plurality of male or female connection features configured to couple to female or male connection features on a logic die.

* * * * *